(12) United States Patent
Li et al.

(10) Patent No.: US 11,355,172 B2
(45) Date of Patent: Jun. 7, 2022

(54) MAGNETIC RANDOM ACCESS MEMORY CELL AND METHOD FOR FORMING A MAGNETIC RANDOM ACCESS MEMORY

(71) Applicants: Semiconductor Manufacturing International (Shanghai) Corporation, Shanghai (CN); Semiconductor Manufacturing International (Beijing) Corporation, Beijing (CN)

(72) Inventors: Xiaohua Li, Shanghai (CN); Yu Li, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/036,481

(22) Filed: Sep. 29, 2020

(65) Prior Publication Data
US 2021/0210128 A1   Jul. 8, 2021

(30) Foreign Application Priority Data
Jan. 6, 2020   (CN) .......................... 202010010415.2

(51) Int. Cl.
*G11C 11/16*      (2006.01)
*H01L 27/22*      (2006.01)

(52) U.S. Cl.
CPC ...... *G11C 11/1657* (2013.01); *G11C 11/1655* (2013.01); *H01L 27/222* (2013.01)

(58) Field of Classification Search
CPC .............. H01L 27/222; G11C 11/1657; G11C 11/1655
See application file for complete search history.

(56) References Cited

U.S. PATENT DOCUMENTS

| | | | | |
|---|---|---|---|---|
| 2007/0159870 A1* | 7/2007 | Tanizaki | ............. | G11C 11/5685 365/148 |
| 2012/0299090 A1* | 11/2012 | Kim | ................. | H01L 29/66666 257/331 |
| 2019/0371383 A1* | 12/2019 | Chiang | ................... | H01L 43/08 |
| 2021/0134882 A1* | 5/2021 | Lin | ......................... | H01L 43/02 |

\* cited by examiner

*Primary Examiner* — Tri M Hoang
(74) *Attorney, Agent, or Firm* — Anova Law Group, PLLC (57) ABSTRACT

A magnetic random access memory cell and a method for forming a magnetic random access memory are provided. The memory cell includes a substrate including a plurality of active regions and a plurality of isolation regions each between adjacent active regions. The memory cell also includes a gate structure over each active region, and a word line structure over each isolation region. In addition, the memory cell includes a source region and a drain region in the substrate on both sides of the gate structure, and a dielectric structure over the substrate. The gate structure and the word line structure are located in the dielectric structure. Further, the memory cell includes a source line structure located in the dielectric structure and electrically connected to the source region over each active region. The word line structure, the gate structure, and the source line structure are parallel to each other.

20 Claims, 6 Drawing Sheets

MAGNETIC RANDOM ACCESS MEMORY CELL AND METHOD FOR FORMING A MAGNETIC RANDOM ACCESS MEMORY

CROSS-REFERENCE TO RELATED APPLICATIONS

This application claims the priority of Chinese patent application No. 202010010415.2, filed on Jan. 6, 2020, the entirety of which is incorporated herein by reference.

FIELD OF THE DISCLOSURE

The present disclosure generally relates to the field of semiconductor manufacturing technology and, more particularly, relates to a magnetic random access memory cell and a method for forming a magnetic random access memory.

BACKGROUND

A magnetic random access memory is a non-volatile memory, which has been widely accepted by the industry as a mainstream data storage memory. The magnetic random access memory integrates a magneto-resistive device and a silicon-based selection matrix. The key attributes of the magnetic random access memory include non-volatile, low operating voltage, durability for unlimited read and write, fast read and write, and easy integration as a back-end technology. The magnetic random access memory is likely to replace many types of memories in various applications due to such attributes.

However, as nodes of the semiconductor technology shrink, the size of semiconductor device is getting smaller and smaller. The existing magnetic random access memory has a substantially large size and is not suitable for advanced semiconductor manufacturing process. The disclosed methods and device structures are directed to solve one or more problems set forth above and other problems.

BRIEF SUMMARY OF THE DISCLOSURE

One aspect of the present disclosure includes a magnetic random access memory cell. The memory cell includes a substrate including a plurality of active regions and a plurality of isolation regions each between adjacent active regions of the plurality of active regions. The memory cell also includes a gate structure over each active region of the plurality of active regions, and a word line structure over each isolation region of the substrate. In addition, the memory cell includes a source region and a drain region in the substrate on both sides of the gate structure, and a dielectric structure over the substrate. The gate structure and the word line structure are located in the dielectric structure. Further, the memory cell includes a source line structure located in the dielectric structure and electrically connected to the source region over each of the plurality of active regions of the substrate. The word line structure, the gate structure, and the source line structure are parallel to each other.

Optionally, a sidewall of the word line structure is in contact with a sidewall of a corresponding gate structure.

Optionally, the source line structure extends along a first direction parallel to a surface of the substrate.

Optionally, the memory cell further includes a magnetic tunnel structure and a bit line structure electrically connected to a top of the magnetic tunnel structure. A bottom of the magnetic tunnel structure is electrically connected to the drain region. The bit line structure extends along a second direction parallel to the surface of the substrate, and the second direction is perpendicular to the first direction. The magnetic tunnel structure and the bit line structure are located in the dielectric structure.

Optionally, a bottom surface of the magnetic tunnel structure is above a top surface of the source line structure.

Optionally, the magnetic tunnel structure includes a fixed layer, an insulating layer over the fixed layer, and a free layer over the insulating layer.

Optionally, a bottom surface of the source line structure is above a top surface of the word line structure and a top surface of the gate structure.

Optionally, the substrate includes a base, a fin structure over the base, and an isolation layer over the base and covering a portion of a sidewall of the fin structure. The fin structure is located in the active region, the gate structure and the word line structure are across the fin structure, and the first direction is perpendicular to an extension direction of the fin structure.

Optionally, a spacing between adjacent fin structures is a first size, and a width of the fin structure is a second size. The first size is less than or equal to the second size.

Optionally, the memory cell further includes a metal layer formed over the substrate. The metal layer includes a first portion including the word line structure, and a second portion including a gate electrode layer of the gate structure.

Another aspect of the present disclosure includes a method for forming a magnetic random access memory. The method includes providing a substrate and forming a gate structure and a word line structure over the substrate. The substrate includes a plurality of active regions and a plurality of isolation regions each between adjacent active regions of the plurality of active regions. The gate structure is located over each active region of the substrate, and the word line structure is located over each isolation region of the substrate. The method also includes forming a source region and a drain region in the substrate on both sides of the gate structure, and forming a dielectric structure over the substrate. The gate structure and the word line structure are located in the dielectric structure. Further, the method includes forming a source line structure located in the dielectric structure and electrically connected to the source region over each of the plurality of active regions of the substrate. The word line structure, the gate structure, and the source line structure are parallel to each other.

Optionally, forming the gate structure and the word line structure includes: forming a metal material layer over the substrate; forming a patterned mask layer on the metal material layer; and forming a metal layer by etching the metal material layer using the patterned mask layer as a mask. The metal layer includes a first portion including the word line structure, and a second portion including a gate electrode layer of the gate structure.

Optionally, a sidewall of the word line structure is in contact with a sidewall of the gate structure.

Optionally, the source line structure extends along a first direction parallel to a surface of the substrate.

Optionally, the method further includes forming a magnetic tunnel structure in the dielectric structure, and forming a bit line structure in the dielectric structure. A bottom of the magnetic tunnel structure is electrically connected to the drain region. The bit line structure is electrically connected to a top of the magnetic tunnel structure, and the bit line structure extends along a second direction parallel to the surface of the substrate. The second direction is perpendicular to the first direction.

Optionally, a bottom surface of the magnetic tunnel structure is above a top surface of the source line structure.

Optionally, the magnetic tunnel structure includes a buffer layer, a fixed layer over the buffer layer, an insulating layer over the fixed layer, a free layer over the insulating layer, and a covering layer over the free layer.

Optionally, a bottom surface of the source line structure is above a top surface of the word line structure and a top surface of the gate structure.

Optionally, the substrate includes a base, a fin structure over the base, and an isolation layer over the base and covering a portion of a sidewall of the fin structure. The fin structure is located in the active region, the gate structure and the word line structure are across the fin structure, and a first direction is perpendicular to an extension direction of the fin structure.

Optionally, a spacing between adjacent fin structures is a first size, and a width of the fin structure is a second size. The first size is less than or equal to the second size.

The disclosed embodiments may have following beneficial effects. In the disclosed magnetic random access memory cell of the present disclosure, the sidewall of the word line structure may be in contact with the sidewall of the gate structure, and the word line structure and the gate structure may be in a same layer, thereby leaving sufficient space for subsequently forming the device over the word line structure. Therefore, the device formation may have a substantially large process window, and the device may be well isolated from the word line structure and the gate structure, which may facilitate to improve the performance of the magnetic random access memory cell.

Further, the source line structure may extend along the first direction parallel to the surface of the substrate, thereby reducing the size of the magnetic random access memory cell in the first direction. Therefore, the area of the magnetic random access memory cell may be reduced, which may facilitate to improve the integration degree of the magnetic random access memory cells, thereby saving the area of the magnetic random access memory.

In the disclosed method for forming the magnetic random access memory, the sidewall of the formed word line structure may be in contact with the sidewall of the gate structure, and the word line structure and the gate structure may be in a same layer, thereby leaving sufficient space for subsequently forming the device over the word line structure. Therefore, the device formation may have a substantially large process window, and the device may be well isolated from the word line structure and the gate structure, which may facilitate to improve the performance of the magnetic random access memory cell, thereby improving the performance of the magnetic random access memory.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
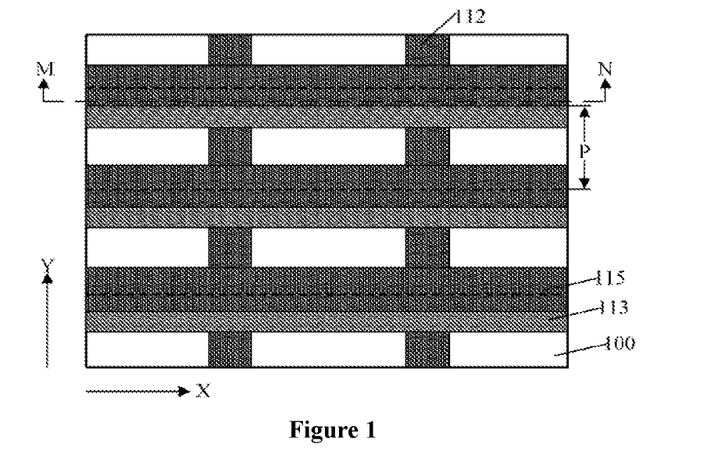
FIGS. 1-2 illustrate schematic diagrams of a magnetic random access memory.
Figure 2:
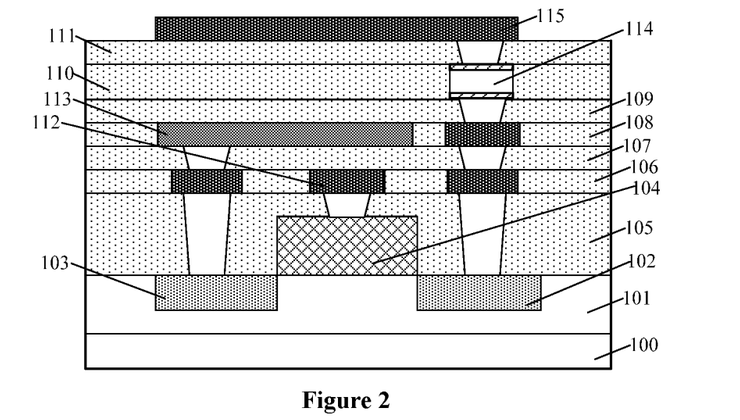

FIGS. 1-2 illustrate schematic diagrams of a magnetic random access memory. FIG. 1 illustrates a top view of a structure in FIG. 2 omitting a dielectric structure, and FIG. 2 illustrates a MN-sectional view of the structure in FIG. 1. Referring to FIG. 1 and FIG. 2, the magnetic random access memory includes a substrate 100 having a fin 101 on the substrate; a gate structure 104 across the fin 101; and a source region 103 and a drain region 102 in the fin 101 on both sides of the gate structure 104. The magnetic random access memory also includes a dielectric structure over the substrate 100. The dielectric structure includes a first dielectric layer 105, a second dielectric layer 106, a third dielectric layer 107, a fourth dielectric layer 108, a fifth dielectric layer 109, a sixth dielectric layer 110 and a seventh dielectric layer 111 that are sequentially stacked. The gate structure 104 is located in the first dielectric layer 105.

In addition, the magnetic random access memory includes a word line structure 112 located in the second dielectric layer 106, where the word line structure 112 is electrically connected to the top of the gate structure 104; a source line structure 113 located in the fourth dielectric layer 108, where the source line structure 113 is electrically connected to the source region 103; a magnetic tunnel structure 114 located in the sixth dielectric layer 110, where the magnetic tunnel structure 114 is electrically connected to the drain region 102; and a bit line structure 115 located on the surface of the seventh dielectric layer 111, where the bit line structure 115 is electrically connected to the top of the magnetic tunnel structure 114.

In a memory cell of the magnetic random access memory, on the one hand, the source line structure 113 is electrically connected to the source region 103 through a second plug (not illustrated) located in the third dielectric layer 107, a first metal layer (not illustrated) located in the second dielectric layer 106, and a first plug (not illustrated) located in the first dielectric layer 105. The word line structure 112 is electrically connected to the top of the gate structure 104 through a first plug (not illustrated) located in the first dielectric layer 105. The source line structure 113 and the word line structure 112 are isolated from each other by the third dielectric layer 107. The source line structure 113 is substantially close to the word line structure 112, to avoid an issue that the process of forming the source line structure 113 damages the third dielectric layer 107 and causes damage to the word line structure 112, the process conditions for forming the source line structure 113 are limited to a certain extent. Therefore, the process window for forming the source line structure 113 is substantially small, which increases the process difficulty. At the same time, the source line structure 113 and the word line structure 112 that are close to each other are likely to be short-circuited, thereby affecting the performance of the magnetic random access memory.

On the other hand, in the memory cell of the magnetic random access memory, the word line structure 112 extends along a second direction Y parallel to the surface of the substrate 100, and the second direction Y is perpendicular to an extension direction of the fin 101. The source line structure 113 and the bit line structure 115 extend along a first direction X parallel to the surface of the substrate 100, and the first direction X is perpendicular to the second direction Y. In other words, the first direction X is the extension direction of the fin 101. The source line structure 113 and the bit line structure 115 have a certain width. Therefore, in the second direction Y, the source line structure 113 and the bit line structure 115 need to occupy a certain space to satisfy the size requirements of source line structure 113 and bit line structure 115.

However, in the structure of a magnetic random access memory formed by a plurality of memory cells, as the nodes of semiconductor technology shrink, the size of a spacing P between adjacent fins 101 becomes smaller and smaller. The memory cell is formed on a single fin, while the source line structure 113 and the bit line structure 115 still need to occupy a certain space. In other words, the formed memory cell requires a certain process window, and a certain space between adjacent fins is required to form the memory cell. Therefore, the size of the spacing P between adjacent fins cannot be further reduced, and the existing magnetic random access memory cannot meet the technical requirements of advanced semiconductor manufacturing process.

The present disclosure provides a magnetic random access memory cell and a method for forming a magnetic random access memory. A word line structure and a gate structure may be formed over a substrate, and a sidewall of the word line structure may be in contact with a sidewall of the gate structure. The word line structure and the gate structure may be located in a same layer, thereby leaving sufficient space for subsequently forming a device over the word line structure. Therefore, the device formation may have a substantially large process window, and the device may be well isolated from the word line structure and the gate structure, which may facilitate to improve the performance of the magnetic random access memory cell. At the same time, the source line structure may extend along a first direction parallel to the surface of the substrate, thereby reducing the size of the magnetic random access memory cell in a direction perpendicular to the first direction. Therefore, an area of the magnetic random access memory cell may be reduced, which may facilitate to improve the integration degree of magnetic random access memory cells.

Figure 13:
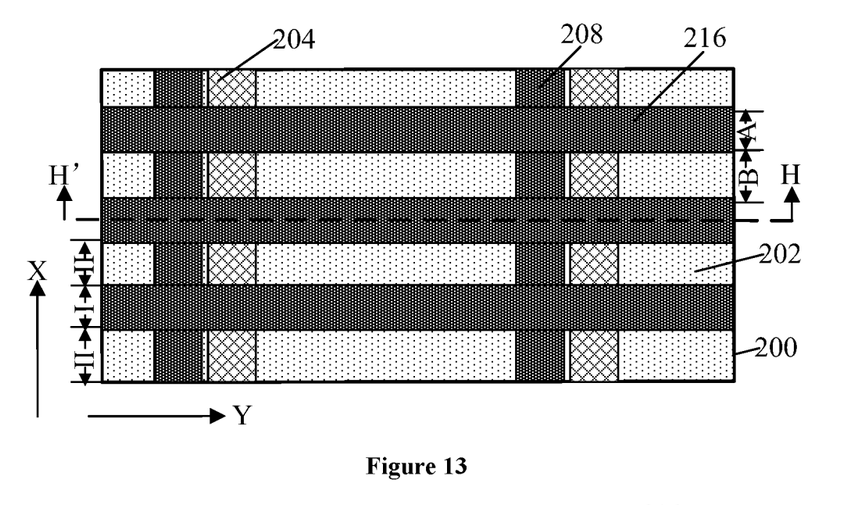
Figure 14:
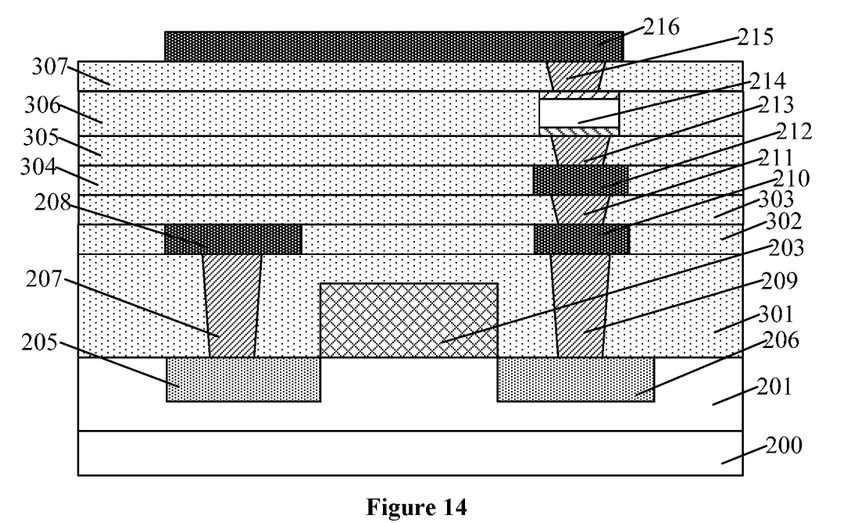
Figure 15:
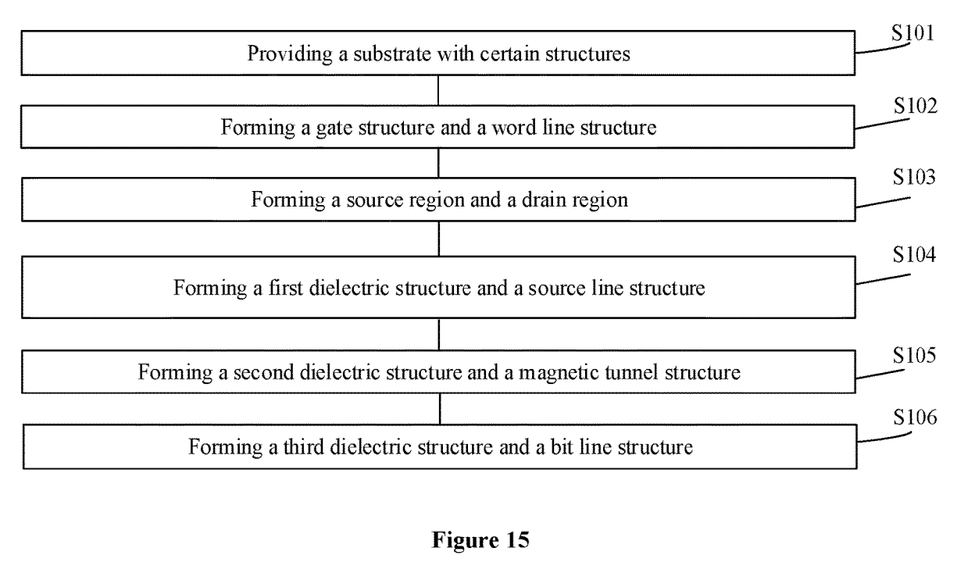
FIG. 15 illustrates a flowchart of an exemplary method for forming a magnetic random access memory consistent with various disclosed embodiments of the present disclosure.

FIG. 15 illustrates a flowchart of a method for forming a magnetic random access memory consistent with various disclosed embodiments of the present disclosure, and FIGS. 3-14 illustrate semiconductor structures corresponding to certain stages of the fabrication method.

Figure 3:
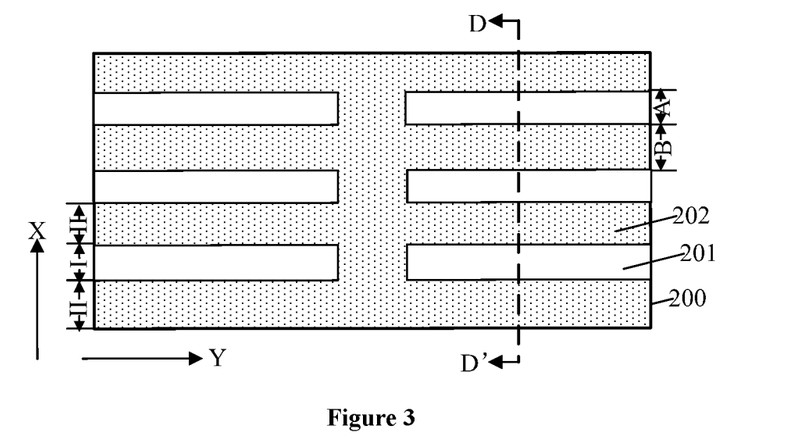
FIGS. 3-14 illustrate semiconductor structures corresponding to certain stages for forming an exemplary magnetic random access memory consistent with various disclosed embodiments of the present disclosure.
Figure 4:
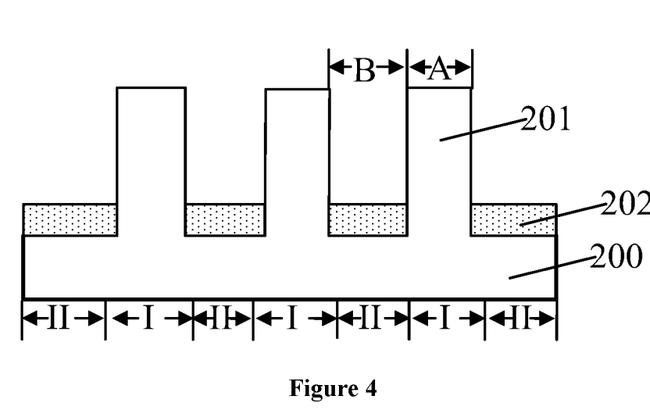

As shown in FIG. 15, at the beginning of the fabrication method, a substrate with certain structures may be provided (S101). FIGS. 3-4 illustrate a corresponding semiconductor structure.

FIG. 3 illustrates a top-view of the structure in FIG. 4, and FIG. 4 illustrates a DD'-sectional view of the structure in FIG. 3. Referring to FIG. 3 and FIG. 4, a substrate may be provided. The substrate may include a plurality of active regions I and an isolation region II between adjacent active regions I.

The active region I may be a region where an active device is formed on the substrate. The active device may include a diode, a triode, a transistor or an integrated circuit. The isolation region II may be a region where an isolation structure is formed on the substrate to electrically isolate the active devices.

In one embodiment, the substrate may include a base 200, a plurality of fin structures 201 over the base 200, and an isolation layer 202 over the base 200 and covering a portion of sidewall of the fin structure 201. The fin structure 201 may be disposed in the active region I.

The plurality of fin structures 201 may be arranged along a first direction X, and the first direction X may be parallel to the surface of the substrate. A fin structure 201 may extend along a second direction Y, and the second direction Y may be perpendicular to the first direction X.

In one embodiment, a memory cell of the magnetic random access memory may be formed on a single fin structure 201. In another embodiment, the memory cell of the magnetic random access memory may be formed on the plurality of fin structures.

A spacing B between adjacent fin structures 201 may be a first size, and a width A of the fin structure 201 may be a second size. The first size may be less than or equal to the second size.

Because the subsequently formed source line structure extends along the first direction X parallel to the surface of the substrate, the size of the magnetic random access memory cell in the first direction X may be reduced, and, thus, an area of the magnetic random access memory cell may be reduced. Therefore, the spacing B between adjacent fin structures 201 may be further reduced, such that the first size may be less than or equal to the second size, thereby improving the integration degree of the magnetic random access memory cells, and reducing the area of the magnetic random access memory.

In another embodiment, the substrate may include a planar substrate. In one embodiment, the base 200 may be made of monocrystalline silicon, the fin structure 201 may be made of monocrystalline silicon, and the isolation layer 202 may be made of a material including silicon oxide.

In certain embodiments, the substrate may include a semiconductor material such as polysilicon, germanium, silicon germanium, gallium arsenide, or silicon-on-insulator, etc. The fin structure may include a semiconductor material such as polysilicon, germanium, silicon germanium, gallium arsenide, or silicon-on-insulator, etc. The isolation layer may be made of a material including silicon nitride, silicon oxynitride, or silicon carbide.

A gate structure and a word line structure may be formed over the substrate. The gate structure may be located over the active region I, and the word line structure may be located over the active region I and the isolation region II. A sidewall of the word line structure may be in contact with a sidewall of the gate structure.

Figure 5:
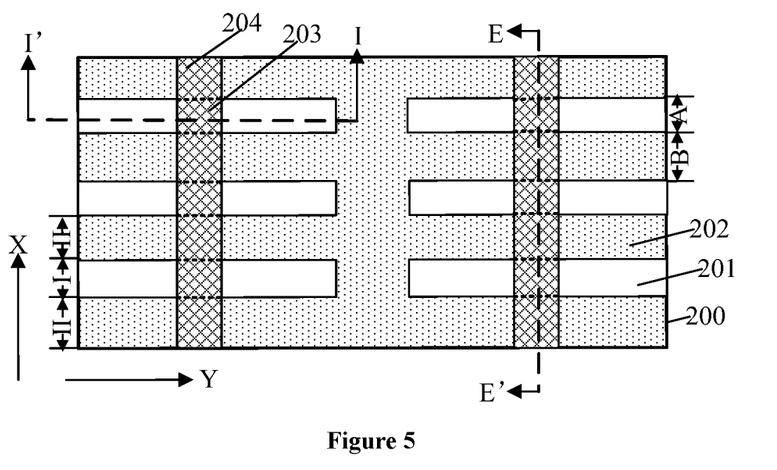
Figure 6:
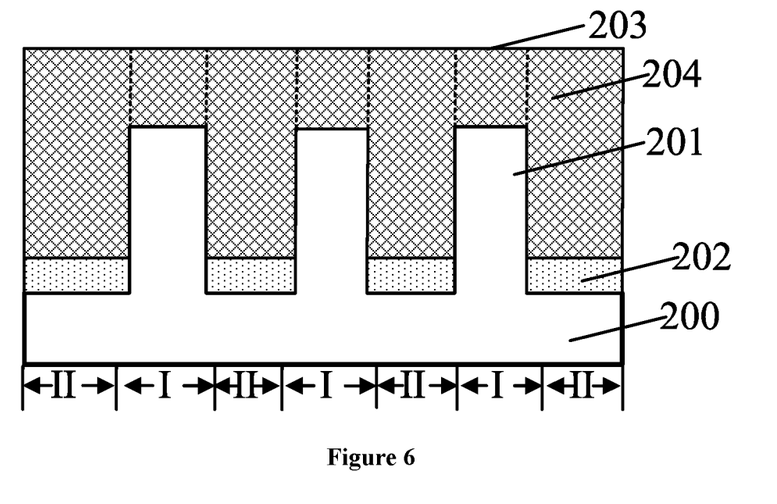
Figure 7:
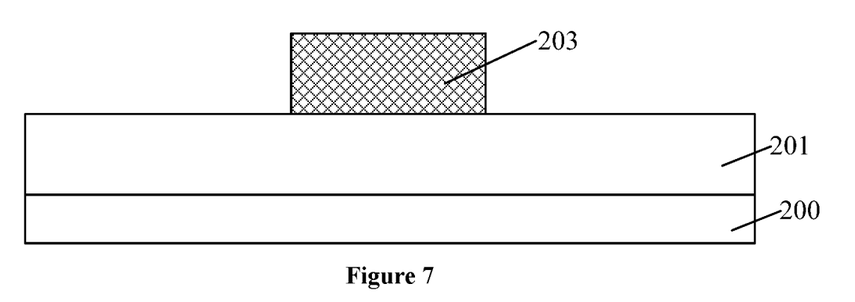

Returning to FIG. 15, after providing the substrate, a gate structure and a word line structure may be formed (S102). FIGS. 5-7 illustrate a corresponding semiconductor structure.

FIG. 5 illustrates a top view of a structure in FIG. 6 and FIG. 7, FIG. 6 illustrates a EE'-sectional view of the structure in FIG. 5, and FIG. 7 illustrates a II'-sectional view of the structure in FIG. 5. Referring to FIGS. 5-7, a gate structure 203 and a word line structure 204 may be formed over the substrate. The gate structure 203 may be located over the active region I, and the word line structure 204 may be located over the active region I and the isolation region II. A sidewall of the word line structure 204 may be in contact with a sidewall of the gate structure 203.

In one embodiment, the gate structure 203 may be across the fin structure 201. In another embodiment, the gate structure may be formed over the substrate.

In one embodiment, forming the gate structure 203 and the word line structure 204 may include: forming a gate material layer (not illustrated) over the substrate; forming a word line material layer (not illustrated) on the gate material layer; forming a patterned mask layer (not illustrated) on the word line material layer; using the patterned mask layer as a mask to etch the word line material layer and the gate material layer until a surface of the substrate is exposed, to form the gate structure 203 and the word line structure 204.

In another embodiment, forming the gate structure and the word line structure may include: forming a metal material layer over the substrate; forming a patterned mask layer on the metal material layer; and forming a metal layer by etching the metal material layer using the patterned mask layer as a mask. The metal layer may include a first portion including the word line structure, and a second portion including a gate electrode layer of the gate structure.

The gate structure 203 may be made of a material including a metal, and the metal may include one or more of tungsten, aluminum, cobalt, titanium, titanium nitride, tantalum, tantalum nitride, ruthenium, and copper. The word line structure 204 may be made of a material including a metal, and the metal may include one or more of tungsten, aluminum, cobalt, titanium, titanium nitride, tantalum, tantalum nitride, ruthenium, and copper.

In one embodiment, the gate structure 203 may be made of a material including tungsten. The word line structure 204 may be made of a material including tungsten. The gate structure 203 may be made of a same material as the word line structure 204. In certain embodiments, the gate structure may be made of a material different from the word line structure.

Forming the gate material layer may include a physical vapor deposition process, an atomic layer deposition process, an electroplating process, or a combination thereof. Forming the word line material layer may include a physical vapor deposition process, an atomic layer deposition process, an electroplating process, or a combination thereof. Etching the word line material layer and the gate material layer may include one or more of a dry etching process and a wet etching process.

In one embodiment, forming the gate material layer may include a physical vapor deposition process. Forming the word line material layer may include a physical vapor deposition process. Etching the word line material layer and the gate material layer may include a dry etching process. The dry etching process may be capable of forming the gate structure 203 and the word line structure 204 with desired sidewall topography.

In one embodiment, the gate material layer and the word line material layer may be simultaneously formed by a single formation process. In another embodiment, the gate material layer and the word line material layer may be separately formed using different processes.

The sidewall of the word line structure 204 may be in contact with the sidewall of the gate structure 203, such that the word line structure 204 may be in a same layer as the gate structure 203, thereby leaving sufficient space for subsequently forming a device over the word line structure. Therefore, the device formation may have a substantially large process window, and the device may be well isolated from the word line structure 204 and the gate structure 203, which may facilitate to improve the performance of the magnetic random access memory cell.

Figure 8:
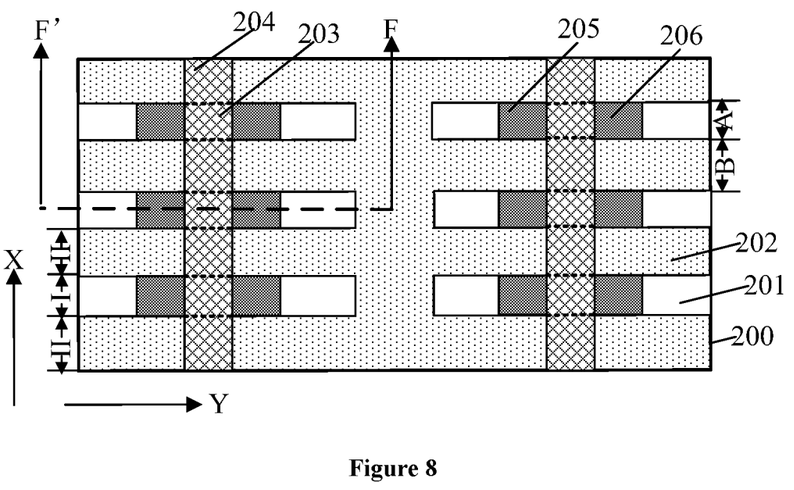
Figure 9:
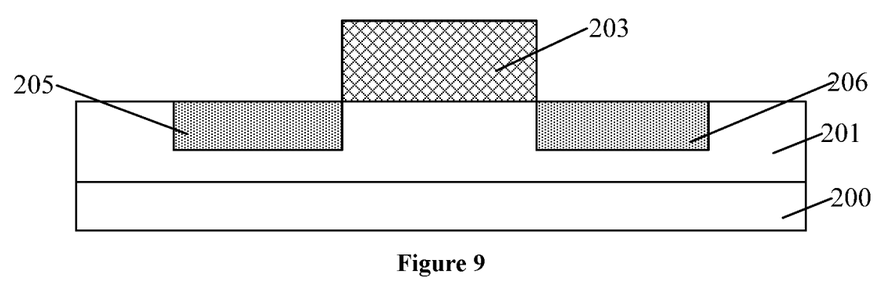

Returning to FIG. 15, after forming the gate structure and the word line structure, a source region and a drain region may be formed (S103). FIGS. 8-9 illustrate a corresponding semiconductor structure.

FIG. 8 illustrates a top view of a structure in FIG. 9, and FIG. 9 illustrates a FF'-sectional view of a single magnetic random access memory cell in FIG. 8. Referring to FIG. 8 and FIG. 9, a source region 205 and a drain region 206 may be formed in the fin structure 201 on both sides of the gate structure 203. In certain embodiments, the source region and the drain region may be formed in the substrate on both sides of the gate structure.

Forming the source region 205 and the drain region 206 may include an epitaxial growth process or an ion implantation process. In one embodiment, forming the source region 205 and the drain region 206 may include an epitaxial growth process. When the magnetic random access memory cell is an N-type device, the source region 205 and the drain region 206 may be made of a material including carbon silicon. When the magnetic random access memory cell is a P-type device, the source region 205 and the drain region 206 may be made of a material including silicon germanium.

Then, a dielectric structure may be formed over the substrate. The gate structure 203 and the word line structure 204 may be located in the dielectric structure. The dielectric structure may include a first dielectric structure, a second dielectric structure, and a third dielectric structure. A magnetic tunnel structure may be formed in the dielectric structure, and a bottom of the magnetic tunnel structure may be electrically connected to the drain region 206. A bit line structure may be formed in the dielectric structure, and the bit line structure may be electrically connected to the top of the magnetic tunnel structure. The bit line structure may extend along a second direction Y parallel to the surface of the substrate. A source line structure may be formed in the dielectric structure, and the source line structure may be electrically connected to the source region 205. The source line structure may extend along a first direction X parallel to the surface of the substrate.

Figure 10:
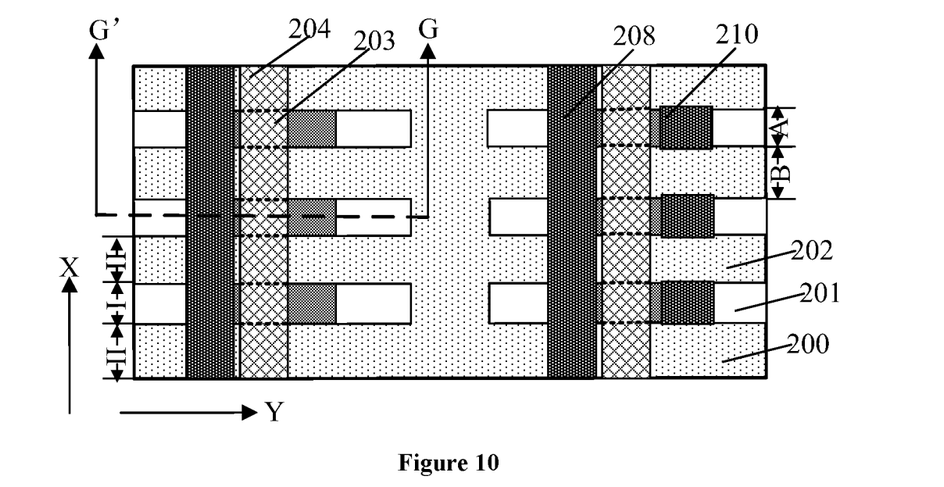
Figure 11:
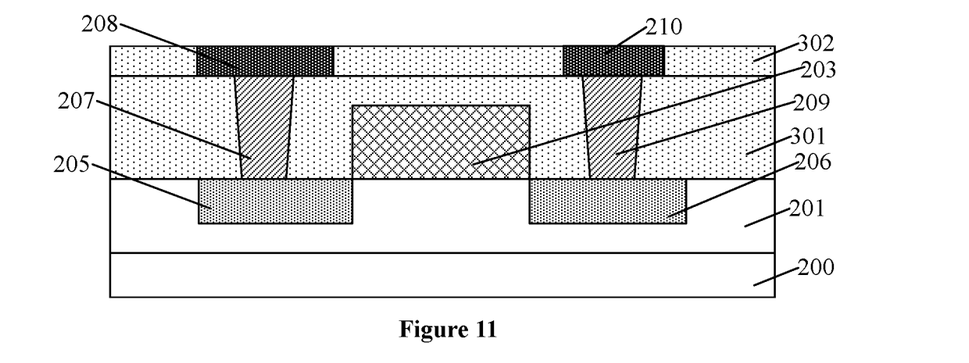

Returning to FIG. 15, after forming the source region and the drain region, a first dielectric structure and a source line structure may be formed (S104). FIGS. 10-11 illustrate a corresponding semiconductor structure.

FIG. 10 illustrates a top view of a structure in FIG. 11 omitting a first dielectric layer 301 and a second dielectric layer 302, and FIG. 11 illustrates a GG'-sectional view of a single magnetic random access memory cell in FIG. 10. Referring to FIG. 10 and FIG. 11, a first dielectric structure may be formed over the substrate. A source line structure 208 may be formed in the first dielectric structure, and the source line structure 208 may be electrically connected to the source region 205. A bottom surface of the source line structure 208 may be above the top surface of the word line structure 204 and the top surface of the gate structure 203.

Because the sidewall of the word line structure 204 is in contact with the sidewall of the gate structure 203, the word line structure 204 may be located in a same layer as the gate structure 203, thereby leaving sufficient space for forming the source line structure over the word line structure 204. Therefore, the formation of the source line structure may have a substantially large process window, and the source line structure may be well isolated from the word line structure 204 and the gate structure 203, which may facilitate to improve the performance of the magnetic random access memory cell, thereby improving the performance of the magnetic random access memory.

The source line structure 208, the word line structure 204 and the gate structure 203 may be parallel to each other. The source line structure may extend along the first direction X parallel to the surface of the substrate. Because the formed source line structure 208 extends along the first direction X parallel to the surface of the substrate, the size of the magnetic random access memory cell in the first direction X may be reduced. Therefore, the area of the magnetic random access memory cell may be reduced, and the spacing B between adjacent fin structures 201 may be further reduced. The issues that when the source line structure extends along the second direction Y, the source line structure needs to occupy the size of the magnetic random access memory cell in the first direction X to cause the area of the magnetic random access memory cell to be substantially large, and the spacing between adjacent fin structures cannot be reduced may be prevented. Accordingly, the integration degree of the magnetic random access memory cells may be improved, thereby saving the area of the magnetic random access memory.

In one embodiment, the first dielectric structure may include a first dielectric layer 301 and a second dielectric layer 302 on the first dielectric layer 301. The second dielectric layer 302 may be configured to provide spatial support for the source line structure 208. The first dielectric layer 301 may be configured to provide spatial support for a plug that electrically connects the bottom of the source line structure 208 and the source region 205, and at the same time, may be configured to electrically isolate various structures.

Forming the source line structure 208 may include: forming the first dielectric layer 301 over the substrate, where the gate structure 203 and the word line structure 204 may be located in the first dielectric layer 301; forming a first opening (not illustrated) in the first dielectric layer 301, where the first opening may expose the surface of the source region 205; forming a plug material layer (not illustrated) in the first opening and on the surface of the first dielectric layer 301; planarizing the plug material layer until the surface of the first dielectric layer 301 is exposed to form a first plug 207 in the first opening, where the first plug 207 may be electrically connected to the source region 205; forming a second dielectric layer 302 on the first dielectric layer 301; forming a second opening (not illustrated) in the second dielectric layer 302, where the second opening exposes the top surface of the first plug 207 and a portion of the surface of the first dielectric layer 301; forming a source line material layer (not illustrated) in the second opening and on the surface of the second dielectric layer 302; and planarizing the source line material layer until the surface of the second dielectric layer 302 is exposed to form the source line structure 208 in the second opening, where the source line structure 208 may be electrically connected to the first plug 207.

The first dielectric layer 301 may be made of a material including one or more of silicon oxide, silicon nitride, silicon oxynitride, silicon oxy-carbo-nitride, and silicon carbide. The second dielectric layer 302 may be made of a material including one or more of silicon oxide, silicon nitride, silicon oxynitride, silicon oxy-carbo-nitride and silicon carbide. The first plug 207 may be made of a material including a metal, and the metal may include one or more of tungsten, aluminum, cobalt, titanium, titanium nitride, tantalum, tantalum nitride, ruthenium and copper. The source line structure 208 may be made of a material including a metal, and the metal may include one or more of tungsten, aluminum, cobalt, titanium, titanium nitride, tantalum, tantalum nitride, ruthenium and copper.

In one embodiment, the first dielectric layer 301 may be made of a material including silicon oxide. The second dielectric layer 302 may be made of a material including silicon oxide. The first plug 207 may be made of a material including titanium. The source line structure 208 may be made of a material including tungsten.

Forming the plug material layer may include a physical vapor deposition process, an atomic layer deposition process, an electroplating process, or a combination thereof. Forming the source line material layer may include a physical vapor deposition process, an atomic layer deposition process, an electroplating process, or a combination thereof.

In one embodiment, forming the plug material layer may include a physical vapor deposition process. Forming the source line material layer may include a physical vapor deposition process. Planarizing the plug material layer may include a chemical mechanical polishing process. Planarizing the source line material layer may include a chemical mechanical polishing process.

In one embodiment, while forming the first plug 207 in the first dielectric layer 301, a second plug 209 may also be formed in the first dielectric layer 301, and the second plug 209 may be electrically connected to the drain region 206. While forming the source line structure 208, a first metal layer 210 may also be formed on the second plug 209, and the first metal layer 210 may be electrically connected to the second plug 209. The second plug 209 and the first metal layer 210 on the second plug 209 may be configured to achieve electrical connection between subsequently formed magnetic tunnel structure and the drain region 206. In certain embodiments, the second plug may not be formed while forming the first plug, and the first metal layer may not be formed while forming the source line structure.

Forming the first dielectric layer 301 may include: forming a dielectric material layer (not illustrated) over the substrate; and planarizing the dielectric material layer to a predetermined thickness to form the first dielectric layer 301. Forming the second dielectric layer 302 may include: forming a dielectric material layer (not illustrated) on the first dielectric layer 301; and planarizing the dielectric material layer to a predetermined thickness to form the second dielectric layer 302.

Figure 12:
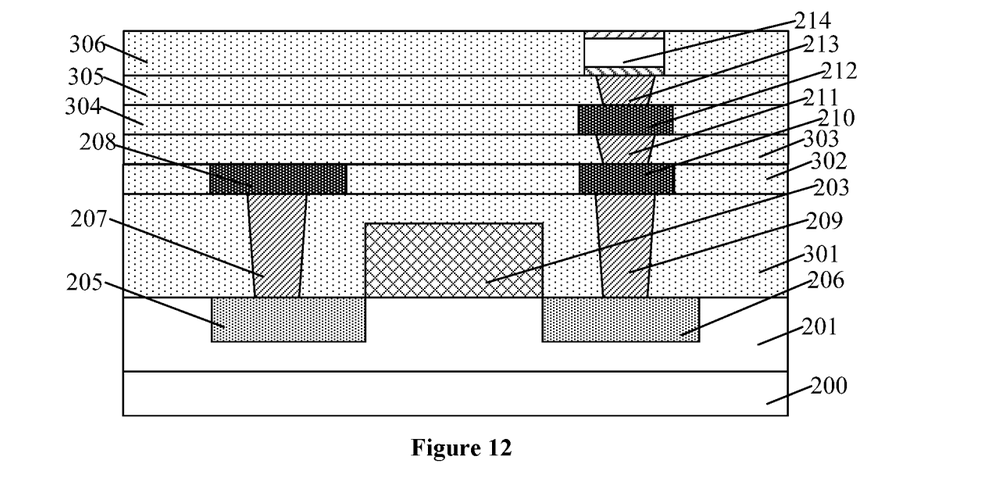

Returning to FIG. 15, after forming the first dielectric structure and the source line structure, a second dielectric structure and a magnetic tunnel structure may be formed (S105). FIG. 12 illustrates a corresponding semiconductor structure.

FIG. 12 illustrates a schematic diagram of a structure on the basis of FIG. 11. Referring to FIG. 12, a second dielectric structure may be formed over the substrate, and a magnetic tunnel structure 214 may be formed in the second dielectric structure. The bottom of the magnetic tunnel structure 214 may be electrically connected to the drain region 206. The bottom surface of the magnetic tunnel structure 214 may be above the top surface of the source line structure 208.

The magnetic tunnel structure 214 may include a fixed layer (not illustrated), an insulating layer (not illustrated) over the fixed layer, and a free layer (not illustrated) over the insulating layer. The fixed layer may be made of a material including a ferromagnetic material, and the ferromagnetic material may include cobalt iron boron, cobalt iron, nickel iron, or cobalt iron nickel. The insulating layer may be made of a material including magnesium oxide, or aluminum oxide. The free layer may be made of a material including a ferromagnetic material, and the ferromagnetic material may include cobalt iron boron, cobalt iron, nickel iron, or cobalt iron nickel.

In one embodiment, the second dielectric structure may include a third dielectric layer 303, a fourth dielectric layer 304 on the third dielectric layer 303, a fifth dielectric layer 305 on the fourth dielectric layer 304, and a sixth dielectric layer 306 on the fifth dielectric layer 305.

The sixth dielectric layer 306 may be configured to provide spatial support for the magnetic tunnel structure 214. The third dielectric layer 303, the fourth dielectric layer 304, and the fifth dielectric layer 305 may be configured to provide spatial support for a plurality of metal layers and plugs that electrically connects the bottom of the magnetic tunnel structure 214 and the drain region 206, and at the same time, may be configured to electrically isolate various structures.

Forming the magnetic tunnel structure 214 may include: forming a third dielectric layer 303 on the second dielectric layer 302; forming a third plug 211 in the third dielectric layer 303, where the third plug 211 may be electrically connected to the first metal layer 210; forming a fourth dielectric layer 304 on the third dielectric layer 303; forming a second metal layer 212 in the fourth dielectric layer 304, where the second metal layer 212 may be electrically connected to the third plug 211; forming a fifth dielectric layer 305 on the fourth dielectric layer 304; forming a bottom electrode 213 in the fifth dielectric layer 305, where the bottom electrode 213 may be electrically connected to the second metal layer 212; forming a magnetic tunnel structure material layer (not illustrated) on the fifth dielectric layer 305; forming a patterned mask layer (not illustrated) on the magnetic tunnel structure material layer, where the patterned mask layer exposes a portion of the surface of the magnetic tunnel structure material layer over the bottom electrode 213; and etching the magnetic tunnel structure material layer using the patterned mask layer as a mask until the surface of the fifth dielectric layer 305 is exposed, to form the magnetic tunnel structure 214.

The materials and formation methods of the third dielectric layer 303, the fourth dielectric layer 304, and the fifth dielectric layer 305 may be the same as the materials and formation methods of the first dielectric layer 301 and the second dielectric layer 302, and details may refer to FIG. 11, which may not be repeated herein.

The materials and formation methods of the third plug 211 and the bottom electrode 213 may be the same as the material and formation method of the first plug 207, and details may refer to FIG. 11, which may not be repeated herein.

After forming the magnetic tunnel structure 214, a sixth dielectric layer 306 may be formed on the fifth dielectric layer 305, and the sixth dielectric layer 306 may expose the top surface of the magnetic tunnel structure 214. The sixth dielectric layer 306 may be made of a material including one or more of silicon oxide, silicon nitride, silicon oxynitride, silicon oxy-carbo-nitride, and silicon carbide. In one embodiment, the sixth dielectric layer 306 may be made of a material including silicon oxide.

Forming the sixth dielectric layer 306 may include: forming a dielectric material layer (not illustrated) on the fifth dielectric layer 305 and on the top and sidewall surfaces of the magnetic tunnel structure 214; and planarizing the dielectric material layer until the top surface of the magnetic tunnel structure 214 is exposed, to form the sixth dielectric layer 306.

Returning to FIG. 15, after forming the second dielectric structure and the magnetic tunnel structure, a third dielectric structure and a bit line structure may be formed (S106). FIGS. 13-14 illustrate a corresponding semiconductor structure.

FIG. 13 illustrates a top view of a structure in FIG. 14 omitting the dielectric structure, and FIG. 14 illustrates a HH'-sectional view of a single magnetic random access memory cell in FIG. 13. Referring to FIG. 13 and FIG. 14, a third dielectric structure may be formed over the substrate, and a bit line structure 216 may be formed on the third dielectric structure. The bit line structure 216 may be electrically connected to the top of the magnetic tunnel structure 214.

The third dielectric structure may include a seventh dielectric layer 307. The seventh dielectric layer 307 may be configured to provide spatial support for the bit line structure 216 electrically connected to the top of the magnetic tunnel structure 214, and at the same time, may be configured to electrically isolate various structures.

Forming the bit line structure 216 may include: forming a seventh dielectric layer 307 on the sixth dielectric layer 306; forming a top electrode 215 in the seventh dielectric layer 307, where the top electrode 215 may be electrically connected to the top of the magnetic tunnel structure 214; forming a bit line material layer (not illustrated) on the seventh dielectric layer 307; forming a patterned mask layer (not illustrated) on the bit line material layer; etching the bit line material layer using the patterned mask layer as a mask until the surface of the seventh dielectric layer 307 is exposed, to form the bit line structure 216. The bit line structure 216 may be electrically connected to the top electrode 215.

The material and formation method of the top electrode 215 may be the same as the material and formation method of the first plug 207, and details may refer to FIG. 11, which may not be repeated herein.

The material and formation method of the seventh dielectric layer 307 may be the same as the materials and formation methods of the first dielectric layer 301 and the second dielectric layer 302, and details may refer to FIG. 11, which may not be repeated herein.

The bit line structure 216 may be made of a material including a metal, and the metal may include one or more of tungsten, aluminum, cobalt, titanium, titanium nitride, tantalum, tantalum nitride, ruthenium and copper. Forming the bit line material layer may include a physical vapor deposition process, an atomic layer deposition process, an electroplating process, or a combination thereof.

In one embodiment, the source line structure 208 may be made of a material including tungsten. Forming the bit line material layer may include a physical vapor deposition process.

The bit line structure 216 may extend along the second direction Y parallel to the surface of the substrate, and the second direction Y may be perpendicular to the first direction X.

The bit line structure 216 may extend along the second direction Y parallel to the surface of the substrate. Because the formed source line structure 208 extends along the first direction X parallel to the surface of the substrate, the size of the magnetic random access memory cell in the first direction X may be reduced. Therefore, the area of the magnetic random access memory cell may be reduced, and the spacing B between adjacent fin structures 201 may be further reduced. The issues that when the source line structure extends along the second direction Y, the source line structure and the bit line structure need to occupy a certain space in the first direction X to cause the area of the magnetic random access memory cell to be substantially large, and the spacing between adjacent fin structures cannot be reduced may be prevented. Accordingly, the integration degree of the magnetic random access memory cells may be improved, thereby saving the area of the magnetic random access memory.

Correspondingly, the present disclosure also provides a magnetic random access memory and a memory cell. Referring to FIG. 13 and FIG. 14, the magnetic random access memory may include a substrate including a plurality of active regions I and an isolation region II between adjacent active regions I; a gate structure 203 over the active region I; and a word line structure 204 over the active region I and the isolation region II, where a sidewall of the word line structure 204 may be in contact with a sidewall of the gate structure 203.

In one embodiment, the substrate may include a base 200, a fin structure 201 over the base 200, and an isolation layer 202 over the base 200 and covering a portion of the sidewall of the fin structure 201. The fin structure 201 may be located over the active region I. The gate structure 203 and the word line structure 204 may be across the fin structure 201.

In one embodiment, a spacing B between adjacent fin structures 201 may be a first size, and a width A of the fin structure 201 may be a second size. The first size may be less than or equal to the second size.

In one embodiment, the magnetic random access memory may further include: a source region 205 and a drain region 206 in the fin structure 201 on both sides of the gate structure 203; and a dielectric structure over the substrate. The gate structure 203 and the word line structure 204 may be located in the dielectric structure.

In one embodiment, the magnetic random access memory may further include a source line structure 208 in the dielectric structure. The source line structure 208 may be electrically connected to the source region 205, and the source line structure 208 may extend along a first direction X parallel to the surface of the substrate, and the first direction X may be perpendicular to an extension direction of the fin structure.

In one embodiment, the magnetic random access memory may further include: a magnetic tunnel structure 214 in the dielectric structure, where a bottom of the magnetic tunnel structure 214 may be electrically connected to the drain region 206; and a bit line structure 216 in the dielectric structure, where the bit line structure 216 may be electrically connected to a top of the magnetic tunnel structure 214. The bit line structure 216 may extend along a second direction Y parallel to the surface of the substrate, and the second direction Y may be perpendicular to the first direction X.

In one embodiment, a bottom surface of the magnetic tunnel structure 214 may be above a top surface of the source line structure 208. In one embodiment, the magnetic tunnel structure 214 may include: a buffer layer; a fixed layer over the buffer layer; an insulating layer over the fixed layer; a free layer over the insulating layer; and a cover layer over the free layer.

In one embodiment, the word line structure 204, the gate structure 203 and the source line structure 208 may be parallel to each other. In one embodiment, a bottom surface of the source line structure 208 may be above top surfaces of the word line structure 204 and the gate structure 203.

In the disclosed magnetic random access memory cell of the present disclosure, the sidewall of the word line structure may be in contact with the sidewall of the gate structure, and the word line structure and the gate structure may be in a same layer, thereby leaving sufficient space for subsequently forming the device over the word line structure. Therefore, the device formation may have a substantially large process window. The device may be well isolated from the word line structure and the gate structure, which may facilitate to improve the performance of the magnetic random access memory cell.

The source line structure may extend along the first direction parallel to the surface of the substrate, thereby reducing the size of the magnetic random access memory cell in the first direction. Therefore, the area of the magnetic random access memory cell may be reduced, which may facilitate to improve the integration degree of the magnetic random access memory cells, thereby saving the area of the magnetic random access memory.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A magnetic random access memory cell, comprising:
   a substrate, including a plurality of active regions and a plurality of isolation regions each between adjacent active regions of the plurality of active regions;
   a gate structure over each active region of the plurality of active regions;
   a word line structure over each isolation region of the substrate;
   a source region and a drain region in the substrate on both sides of the gate structure;
   a dielectric structure over the substrate, wherein the gate structure and the word line structure are located in the dielectric structure; and
   a source line structure located in the dielectric structure and electrically connected to the source region over each of the plurality of active regions of the substrate, wherein:
   the word line structure, the gate structure, and the source line structure are parallel to each other, and
   a top surface of the gate structure is coplanar with a top surface of the word line structure, and each gate structure is directly sandwiched by two corresponding adjacent word line structures.

2. The memory cell according to claim 1, wherein:
   the word line structure and the gate structure are located in a same layer between the source line structure and the source region, and
   a sidewall of the word line structure is in contact with a sidewall of a corresponding gate structure.

3. The memory cell according to claim 1, wherein:
   the source line structure extends along a first direction parallel to a surface of the substrate.

4. The memory cell according to claim 3, further including:
   a magnetic tunnel structure, wherein a bottom of the magnetic tunnel structure is electrically connected to the drain region; and
   a bit line structure, electrically connected to a top of the magnetic tunnel structure, wherein:

the bit line structure extends along a second direction parallel to the surface of the substrate, and the second direction is perpendicular to the first direction, and the magnetic tunnel structure and the bit line structure are located in the dielectric structure.

5. The memory cell according to claim 4, wherein:
a bottom surface of the magnetic tunnel structure is above a top surface of the source line structure.

6. The memory cell according to claim 4, wherein:
the magnetic tunnel structure includes a fixed layer, an insulating layer over the fixed layer, and a free layer over the insulating layer.

7. The memory cell according to claim 3, wherein:
a bottom surface of the source line structure is above the top surface of the word line structure and the top surface of the gate structure.

8. The memory cell according to claim 1, wherein:
the substrate includes a base, a fin structure over the base, and an isolation layer over the base and covering a portion of a sidewall of the fin structure,
the fin structure is located in the active region,
the gate structure and the word line structure are across the fin structure, and
a first direction is perpendicular to an extension direction of the fin structure.

9. The memory cell according to claim 8, wherein:
a spacing between adjacent fin structures is a first size, and a width of the fin structure is a second size, wherein the first size is less than or equal to the second size.

10. The memory cell according to claim 1, further including:
a metal layer formed over the substrate, wherein the metal layer includes:
a first portion including the word line structure, and
a second portion including a gate electrode layer of the gate structure.

11. A method for forming a magnetic random access memory, comprising:
providing a substrate, wherein the substrate includes a plurality of active regions and a plurality of isolation regions each between adjacent active regions of the plurality of active regions;
forming a gate structure and a word line structure over the substrate, wherein the gate structure is located over each active region of the substrate, and the word line structure is located over each isolation region of the substrate;
forming a source region and a drain region in the substrate on both sides of the gate structure;
forming a dielectric structure over the substrate, wherein the gate structure and the word line structure are located in the dielectric structure
forming a source line structure located in the dielectric structure and electrically connected to the source region over each of the plurality of active regions of the substrate, wherein:
the word line structure, the gate structure, and the source line structure are parallel to each other, and
a top surface of the gate structure is coplanar with a top surface of the word line structure, and each gate structure is directly sandwiched by two corresponding adjacent word line structures.

12. The method according to claim 11, wherein forming the gate structure and the word line structure includes:
forming a metal material layer over the substrate;
forming a patterned mask layer on the metal material layer; and
forming a metal layer by etching the metal material layer using the patterned mask layer as a mask, wherein the metal layer includes a first portion including the word line structure, and a second portion including a gate electrode layer of the gate structure.

13. The method according to claim 11, wherein:
the word line structure and the gate structure are located in a same layer between the source line structure and the source region, and
a sidewall of the word line structure is in contact with a sidewall of the gate structure.

14. The method according to claim 13, wherein:
the source line structure extends along a first direction parallel to a surface of the substrate.

15. The method according to claim 14, further including:
forming a magnetic tunnel structure in the dielectric structure, wherein a bottom of the magnetic tunnel structure is electrically connected to the drain region; and
forming a bit line structure in the dielectric structure, wherein:
the bit line structure is electrically connected to a top of the magnetic tunnel structure, and
the bit line structure extends along a second direction parallel to the surface of the substrate, and the second direction is perpendicular to the first direction.

16. The method according to claim 15, wherein:
a bottom surface of the magnetic tunnel structure is above a top surface of the source line structure.

17. The method according to claim 15, wherein:
the magnetic tunnel structure includes a buffer layer, a fixed layer over the buffer layer, an insulating layer over the fixed layer, a free layer over the insulating layer, and a covering layer over the free layer.

18. The method according to claim 14, wherein:
a bottom surface of the source line structure is above the top surface of the word line structure and the top surface of the gate structure.

19. The method according to claim 11, wherein:
the substrate includes a base, a fin structure over the base, and an isolation layer over the base and covering a portion of a sidewall of the fin structure,
the fin structure is located in the active region,
the gate structure and the word line structure are across the fin structure, and
a first direction is perpendicular to an extension direction of the fin structure.

20. The method according to claim 19, wherein:
a spacing between adjacent fin structures is a first size, and a width of the fin structure is a second size, wherein the first size is less than or equal to the second size.

* * * * *